(12) United States Patent
Klinkhamer et al.

(10) Patent No.: US 7,177,009 B2
(45) Date of Patent: Feb. 13, 2007

(54) POSITION DETERMINATION METHOD AND LITHOGRAPHIC APPARATUS

(75) Inventors: Jacob Frederik Friso Klinkhamer, Delft (NL); Anastasius Jacobus Anicetus Bruinsma, Delft (NL); Martinus Hendrikus Antonius Leenders, Rotterdam (NL); Hubert Adriaan Van Mierlo, Maassluis (NL)

(73) Assignee: ASML Netherlands B.V., Veldhoven (NL)

( * ) Notice: Subject to any disclaimer, the term of this patent is extended or adjusted under 35 U.S.C. 154(b) by 160 days.

(21) Appl. No.: 10/954,654

(22) Filed: Oct. 1, 2004

(65) Prior Publication Data

US 2006/0072087 A1 Apr. 6, 2006

(51) Int. Cl.
*G03B 27/32* (2006.01)
*G03B 27/42* (2006.01)

(52) U.S. Cl. .......................... 355/53; 355/77
(58) Field of Classification Search ............. 355/53, 355/40, 72, 75, 77; 382/209
See application file for complete search history.

(56) References Cited

U.S. PATENT DOCUMENTS 3,898,617 A 8/1975 Kashioka et al.
6,410,193 B1 6/2002 Stivers et al.
6,437,858 B1* 8/2002 Kouno et al. ............... 356/124
6,539,106 B1* 3/2003 Gallarda et al. ............ 382/149
6,949,755 B2* 9/2005 Tanaka ..................... 250/491.1
2002/0172876 A1 11/2002 Baselmans

FOREIGN PATENT DOCUMENTS

| JP | 60-232240 | 11/1985 |
| JP | 2004-272195 | 9/2004 |
| JP | 2005-49580 | 2/2005 |
| WO | WO 2005/001593 A2 | 6/2005 |
| WO | WO 2005/001593 A3 | 6/2005 |

OTHER PUBLICATIONS

"Matrix coding for optical identification of die", Research Disclosure Database No. 467095 (Mar. 2003).

* cited by examiner

*Primary Examiner*—Rodney Fuller
(74) *Attorney, Agent, or Firm*—Pillsbury Winthrop Shaw Pittman, LLP (57) ABSTRACT

An embodiment of the invention may be applied to measure the positions of features in a alignment region on a mask with a sensor. The positions of the features in the alignment region are known from the design. A feature of which the position is measured, is identified by comparing the relative positions between measured features with relative positions known from the design. The known position of the identified feature is subtracted from a measured position of the identified feature to give the position of the mask.

25 Claims, 5 Drawing Sheets

POSITION DETERMINATION METHOD AND LITHOGRAPHIC APPARATUS

FIELD OF THE INVENTION

The present invention relates lithographic methods and apparatus, and to methods for determining a position of an object.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Printed circuit boards and IC's are normally processed several times to create several patterns on top of each other. It may be very important that the target portions are located at precisely determined positions above each other; this is usually called overlay. Good overlay is obtained by aligning the substrate with respect to the patterning structure, which is usually called alignment.

Conventionally substrates are provided with alignment marks whose positions relative to the target portions are known. During alignment an alignment sensor measures the positions of the alignment marks. In this way, the positions of the target portions may be determined. The alignment sensor can only view a small area on the substrate at a given time (this can be considered to be the footprint of the alignment sensor). Often, when alignment is begun, the alignment mark does not coincide with the area viewed by the alignment sensor. To solve this problem, the substrate is scanned underneath the alignment sensor, over a distance sufficiently large that it is certain that the alignment mark passes through the area viewed by the alignment sensor. The position of the alignment mark is measured as it passes through the area viewed by the alignment sensor.

A possible disadvantage of this alignment method is that scanning of the substrate is time consuming, and thus effects the number of substrates that can be processed by the lithographic apparatus per hour.

Instead of using alignment marks, U.S. Pat. No. 3,898,617 describes alignment by measuring positions of circuit features, i.e. alignment is direct to the circuit features. The alignment sensor views a small area of a target portion on the substrate. The sensor records an image of the circuit features located in the area of the target portion. The image is compared to a library which comprises images of circuit features and their associated locations. When a match is found between the measured image and a library image, the associated location retrieved from the library gives the location of the substrate.

A possible disadvantage of this method is that a time consuming scan of the substrate underneath the alignment sensor may be needed until a recorded image is found which matches an image in the library.

SUMMARY

According to one embodiment, a method of determining, in a lithographic apparatus having a sensor, a position of an object provided with a plurality of features having unique positions relative to one another, comprises providing reference information indicating, relative to a position of one of the plurality of features, the positions of the rest of the plurality of features; using the sensor to measure positions of each of a subset of the plurality of features, the measured positions including a reference position in a coordinate system; identifying a feature in the subset, based upon the measured position of the feature relative to the other measured features; and determining a position of the object, based on the identity of the identified feature, the reference information, and the measured reference position in the coordinate system.

A lithographic apparatus according to another embodiment comprises an object table configured to support an object, the object being provided with a plurality of features having unique positions relative to one another; a position sensor arranged to detect each of a subset of the plurality of features; a memory unit configured to store reference information indicating, relative to a position of a reference feature of the plurality of features, the positions of the rest of the plurality of features; and a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system.

According to a further embodiment, a method of determining a position of an object provided with a plurality of features, each of the plurality of features having a unique position in a two-dimensional plane relative to any other two of the plurality of features, comprises using a sensor of a lithographic apparatus to measure positions of each of a subset of the plurality of features; identifying a feature in the subset, based upon the measured position of the feature relative to the other measured features; and determining a position of the object, based on (A) the identity of the identified feature, (B) reference information indicating, relative to a position of a reference feature of the plurality of features, the positions of the rest of the plurality of features, and (C) a position of the reference feature in a coordinate system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiments of the present invention include a method for determining the position of an object without scanning the object and a lithographic apparatus capable of determining the position of an object without scanning the object.

Using a method according to one embodiment of the invention, the sensor can be placed over any part of the alignment region and the position can be determined. No scans are needed. Using an apparatus according to one embodiment of the invention, the position of a patterning structure can be determined, without a need for the apparatus to scan the patterning structure.

Figure 1:
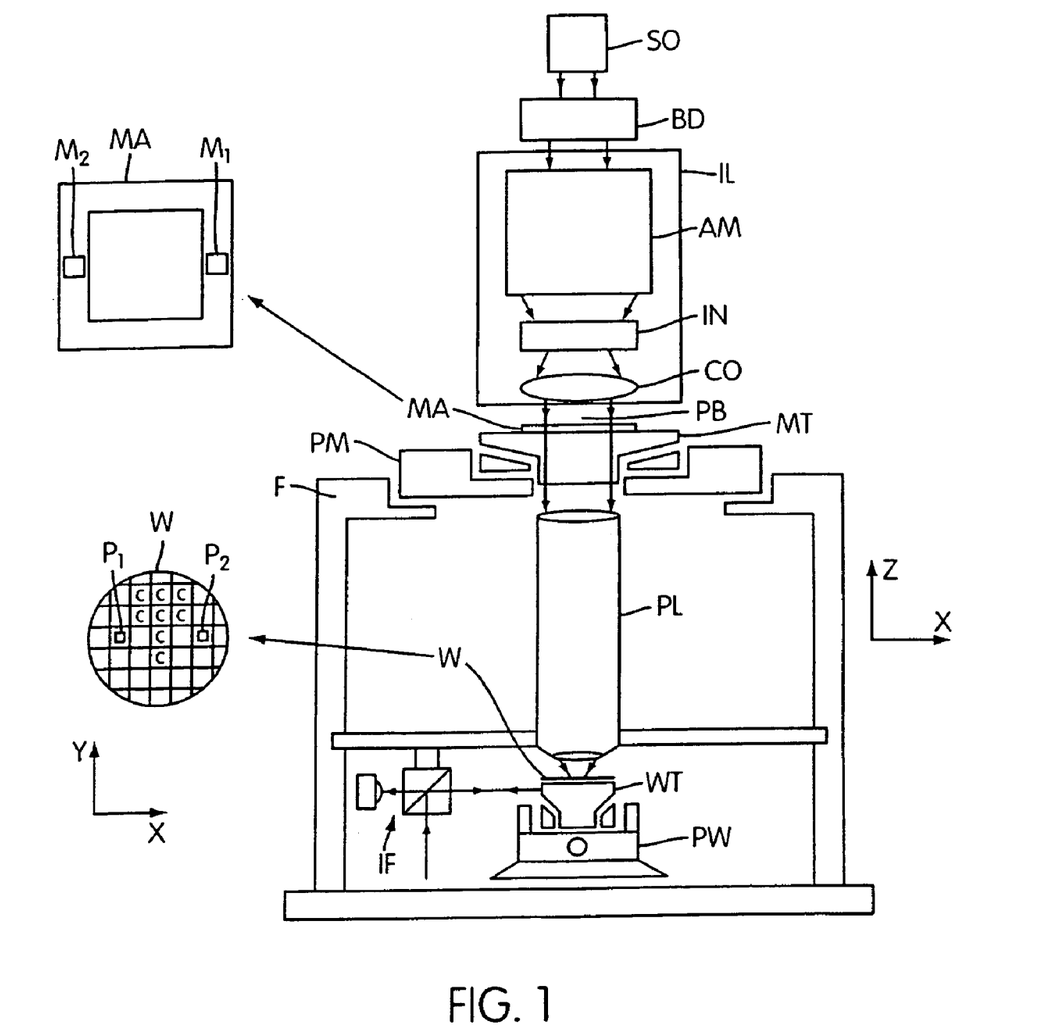
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation or DUV radiation).

a first support structure (e.g. a mask table) MT for supporting patterning structure (e.g. a mask) MA and connected to first positioner PM for accurately positioning the patterning structure with respect to item PL;

a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by patterning structure MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the beam. Generally, at least the outer and/or inner radial extent (commonly referred to as R-outer and a-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioner PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

The lithographic apparatus is represented in FIG. 1 with a rectangular coordinate system. In the coordinate system, z is defined as being parallel to the optical axis of the projection system PL. The x and y coordinates are perpendicular to the optical axis of the projection system.

Figure 2:
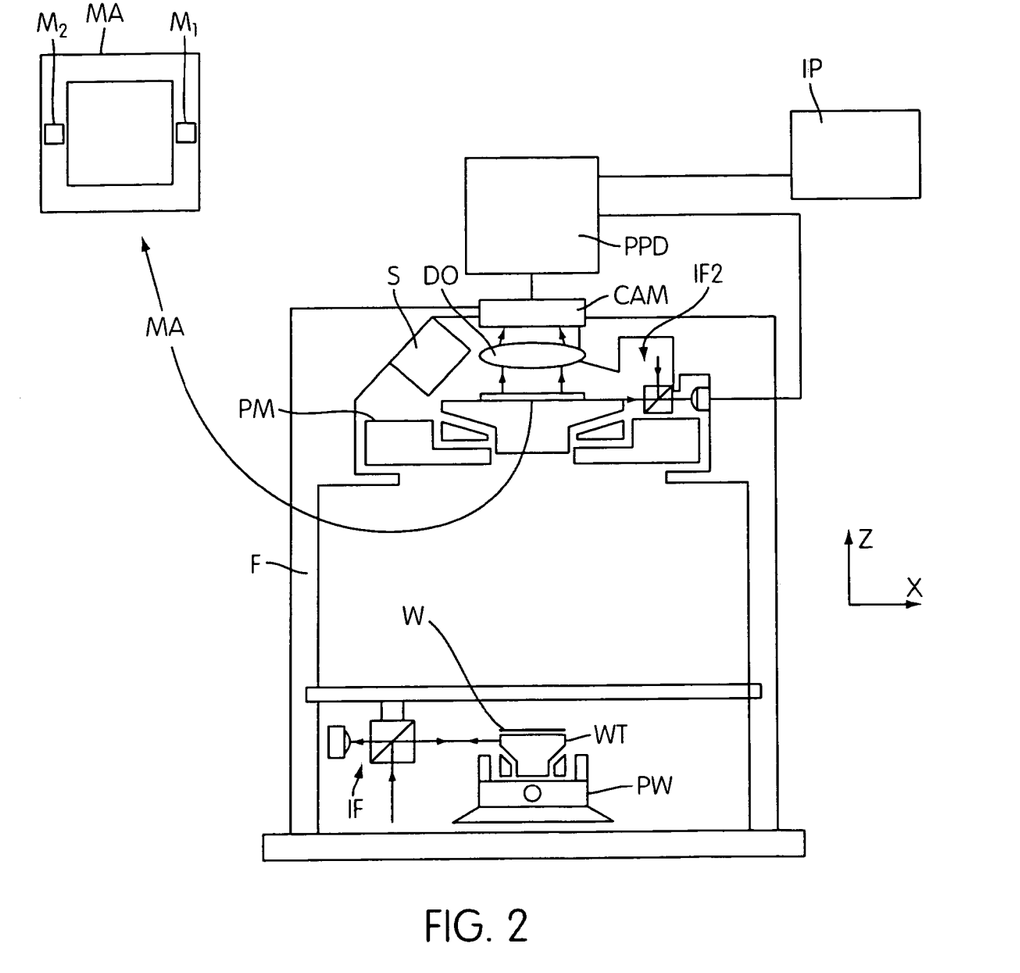
FIG. 2 depicts the lithographic apparatus of FIG. 1 in another cross section.

FIG. 2 shows a cross section of the lithographic apparatus of FIG. 1 at a different y-position compared to FIG. 1. In an embodiment of the invention a source S of measurement radiation is fixed on a frame F (or, has a known position relative to frame F). The measurement-radiation is directed to an alignment mark M1 on mask MA. Sensor detection optics DO form an image of the alignment mark M1 onto a camera CAM (having a CCD, CMOS, or other such sensor). A representation of the image formed onto the camera CAM is retrieved by a position processing device PPD. Position processing device PPD (e.g. a processor, embedded processor, or other array of logic elements executing a set of instructions in firmware and/or software) determines the position of the mask. The position processing device PPD gets input from position sensor IF2, camera CAM and input device IP. Position sensor IF2 is fixed to frame F (or, has a known position relative to frame F) and measures the position of the first positioner PM. In this embodiment, position sensor IF2 is an interferometer which has its base fixed to frame F and its moving part on the first positioner PM. Thus, the location of the first positioner PM is known relative to the frame when camera CAM is read. Input device IP is a keyboard, touch screen, mouse, or other device for data entry.

Figure 3:
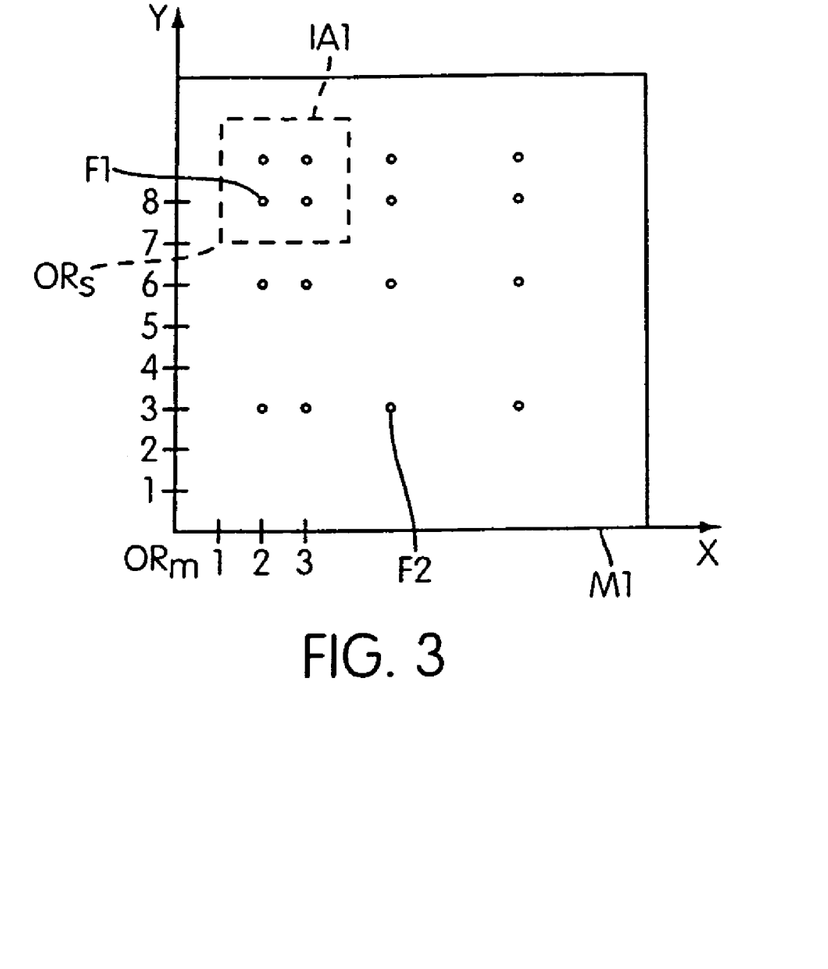
FIG. 3 depicts an alignment region containing several features.

FIG. 3 schematically shows the region of the mask which contains the alignment mark. Also shown in FIG. 3 is the xy coordinate system of FIG. 1. This region on the mask is referred to herein as the alignment region. The alignment region can be much larger than the area which is measured during alignment, the measurement area. Valid alignment measurements can be performed at multiple positions of the measurement area within the alignment region.

The alignment region M1 consists of a number of features (indicated in FIG. 3 by dots, one dot indicating one feature) distributed over the alignment region M1. The features are formed by small areas with high reflectivity which reflect radiation emitted by the measurement radiation source S. The area surrounding the features is the background and has lower reflectivity.

Reference information indicating the positions of the features is stored in position processing device PPD, relative to an origin ORm of a Cartesian coordinate system of the alignment region M1. The positions of the features are designed so that the distances between the features in x- and y-directions can identify the features itself For instance, only feature F1 has a distance to the next neighbor in the positive x-direction of 1 unit and has a distance to the next neighbor in the positive y-direction of 1 unit. Only feature F2 has a distance to the next neighbor in the positive x-direction of 3 units and has a distance to the next neighbor in the positive y-direction of 3 units.

For a given feature, position processing device PPD determines the distances in the positive x- and y-direction to the next features, using the stored positions of the features. Position processing device PPD stores the distances in x- and y-directions for that feature in a table. This may be repeated for the other features.

Only a part of the total alignment region M1 is imaged by detection optics DO. This is the measurement area IA1. The measurement area IA1, indicated by the dashed line in FIG. 3, is visible to the camera CAM. The measurement area IA1 contains four features (F1 and three other features), which form a subset of the features in alignment region M1.

The output of the camera CAM comprises an image of the measurement area IA1 (shown in FIG. 4) converted to electronic data. Position processing device PPD may have no prior knowledge on the identities of the four features in the measurement area IA1 indicated by dots and may labels the features as U1, U2, U3 and U4. Position processing device PPD determines the positions of features U1, U2, U3 and U4 relative to an origin ORs of a Cartesian coordinate system of the camera CAM (e.g. of the camera's sensor). One unit in the Cartesian coordinate system of the camera CAM corresponds to one unit in the Cartesian coordinate system of the alignment region. The positions are used to calculate and store the distances of the features in the measurement area IA1 to the next features in the positive x- and y-direction. The distances are stored for each of the unidentified features (i.e. U1, U2, U3 and U4).

Figure 4:
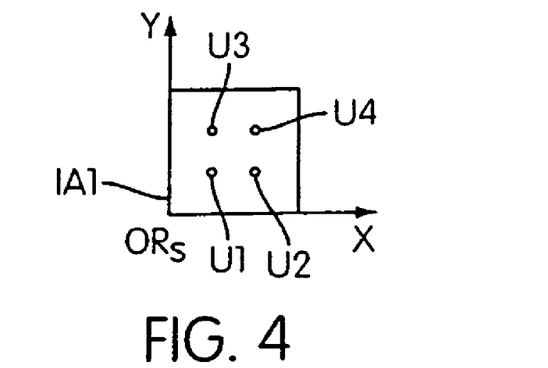
FIG. 4 depicts an image of a part of an alignment region containing several features.

Feature U1 in image IA1 has a distance to next neighbor in the positive x-direction of 1 unit and also has a distance to the next neighbor in the positive y-direction of 1 unit.

Since only feature F1 in alignment region M1 has a distance to the next neighbor in the positive x-direction of 1 unit and a distance to the next neighbor in the positive y-direction of 1 unit as well, position processing device PPD identifies feature U1 in image IA1 as feature F1 in alignment region M1 using the calculated distances.

Using the identity of feature U1, the position of the alignment region can be determined relative to the position of the camera CCD. The positions of the features are stored in position processing device PPD relative to the origin ORm of the alignment region. In this example the coordinates of feature F1 in the alignment region are (2,8), where the first numbers between brackets indicate the x-coordinate and the second numbers indicate the y-coordinate. The coordinates of the identified feature U1 in the image IA1 are known relative to the origin ORs of the camera CAM and are (1,1). The position of the origin ORm of the alignment region with respect to the origin ORs of the camera CAM ORs is determined by:

$$ORm = Coordinates U1 - Coordinates F1,$$

where CoordinatesU1 stands for the coordinates of feature U1 and wherein CoordinatesF1 stands for the coordinates of feature F1.

In the example of FIG. 3 and FIG. 4 using feature F1, the position of the origin ORm of the alignment region M1 in the coordinate system of the camera CAM is ORm=(1,1)−(2,8)=(−1,−7).

The position of the alignment region M1 on the mask MA is known. Therefore, the mask can be aligned with respect to the lithographic apparatus.

It will be appreciated by a person skilled in the art, that it is not necessary to store the positions of all features in alignment region M1 in position processing device PPD. The features for which no positions out of the reference information are stored are either not measured, or their measured positions do not lead to an identification.

Figure 5:
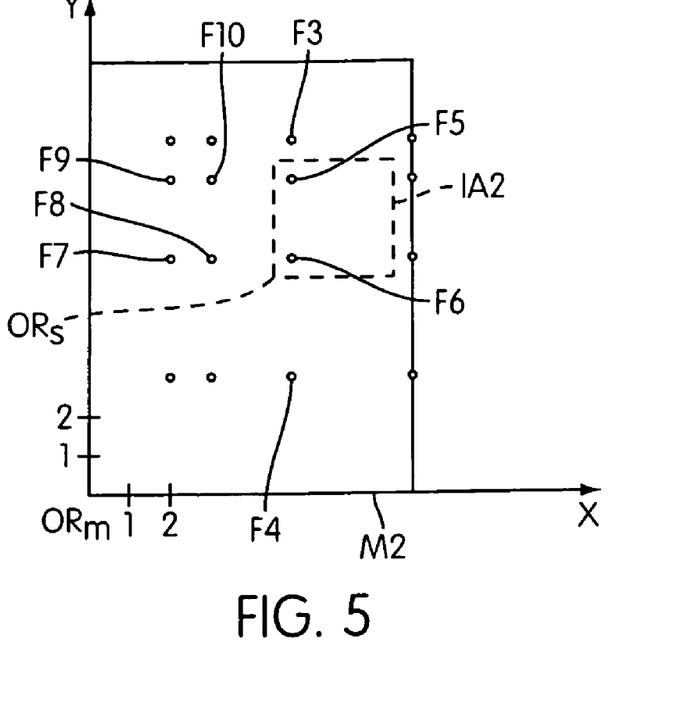
FIG. 5 depicts an alignment region containing several features.

FIG. 5 shows an alignment region M2 in an embodiment of the invention. The dots in FIG. 5 indicate individual features. Only part of the total alignment region M2 is imaged by detection optics DO. This is the measurement area IA2. The measurement area IA2 is indicated by a dashed line and contains two features F5, F6.

The output of the camera CAM comprises an image of the measurement area IA2 (shown in FIG. 6) converted to electronic data. Position processing device PPD may have no prior knowledge of the identities of the features in measurement area IA2. Position processing device PPD determines the positions in the coordinate system of the camera CAM of the two features in the measurement area IA2 as (0.5,2.5) for U5 and (0.5,0.5) for U6. The positions are used to determine and store the distance of the feature U6 in the measurement area IA2 to feature U5, the next feature in the positive y-direction. This distance is stored.

Figure 6:
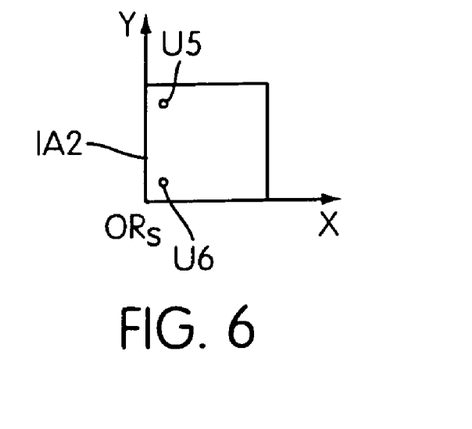
FIG. 6 depicts an image of a part of an alignment region containing several features.

Feature U5 does not have a neighbor in the positive x-direction. The edge of the image IA2 is at 2.5 units in the positive x-direction. Only features F3, F4, F5 and F6 in the alignment region M2 do not have neighbors in the positive x-direction within a distance of less than 2.5 units. Therefore feature U5 is identified as anyone of features F3, F4, F5 or F6.

Feature U5 does not have a neighbor in the positive y-direction, whereas the distance of feature U5 to the edge of image IA2 is 0.5 units. In the table stored in the position processing device PPD, all distances to neighbors in the positive y-direction are at least 1 unit. Therefore it cannot be identified further.

Feature U6 has a neighbor in the positive y-direction at a distance of 2 units. Since only features F7, F8 and F6 have the nearest neighbors in the positive y-direction at a distance of 2 units feature U6 is identified as anyone of features F7, F8 and F6.

With feature U6 identified as being one of features F7, F8 or F6, feature U5 is identified as being one of features F9, F10 or F5. Since feature U5 was already identified as being one of features F3, F4, F5 or F6 the combination leads to the identification of feature U5 as feature F5.

The position of the origin of the alignment region in the coordinate system of the camera CAM can be found using the identity of feature F5 as $$ORm = Coordinates U5 - Coordinates F5$$

where the coordinates CoordinatesF5 of feature F5 are in the coordinate system of the alignment region, and the coordinates CoordinatesUS of feature U5 are in the coordinate system of the camera CAM. This then allows alignment of the mask with respect to the lithographic apparatus.

It will be appreciated by a person skilled in the art that it may be desirable to design the alignment region such that the measurement area will contain a sufficient number of features to uniquely identify at least one feature in each possible image. For instance the features can be placed in the alignment region randomly. It can be assumed that a sufficient number of features is present in each possible image, by choosing a high density of features.

There may be a solitary feature in the alignment region, that is remote from all other features in the alignment region. If the measurement area is placed over such a solitary feature and none of the other features is present in the measurement area, the solitary feature may still be identified. Identification is performed by checking if there is no other feature in the reference information stored in position processing device PPD, that can be in the measured position relative to the camera CAM without other features visible to the camera CAM.

Figure 7:
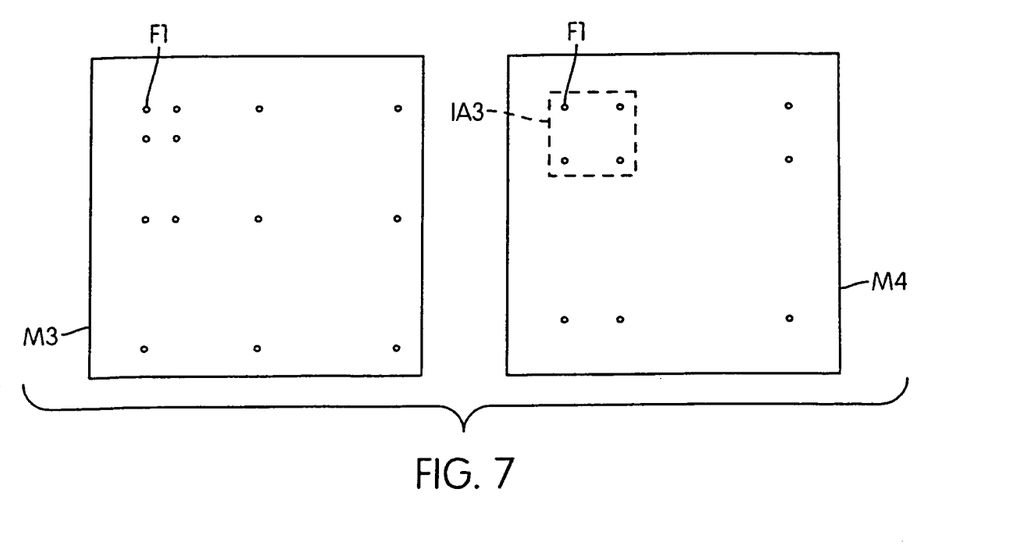
FIG. 7 depicts two alignment regions each on a different object.
Figure 8:
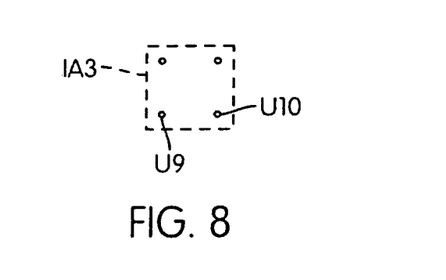
FIG. 8 depicts the image of a part of an alignment region containing several features.

In an embodiment of the invention, measured distances between features on a mask can be used to identify the alignment region or even the mask. Mask MA3 comprises a alignment region M3 (FIG. 7) and mask MA4 comprises a alignment region M4 (FIG. 7). Alignment region M4 has the same size as alignment region M3. Both alignment regions M3,M4 contain a basic feature F1 (indicated in FIG. 7 by a dot) at coordinates (2,10) and contain the same pattern of features (indicated in FIG. 7 by dots). However all distances to the basic feature are multiplied by a factor 2 in alignment region M4 relative to the distances in alignment region M3. Some features which are present in the alignment region M3 do not have a counterpart in alignment region M4 because their distance to the basic feature F1 is so large that they fall outside alignment region M4. The distances in each of the axial directions in alignment region M3 are chosen to be odd numbers of units (such as 1,3, . . . ). This means that the distances in each of the axial directions in alignment region M4 are even numbers of units (such as 2 and 6). Measuring the distance between 2 features with the same x-coordinate will now identify the features and the alignment region M3 on mask MA3 or alignment region M4 on mask MA4 as well. Part of the alignment region M4 is imaged by detection optics DO (FIG. 1). FIG. 8 shows the image IA3 visible to camera CAM.

FIG. 8 shows features U9 and U10 indicated by dots in image IA3 in FIG. 7. The distance between features U9 and U10 is (2,0). Therefore, the alignment region from which the image is taken is identified as M4. Since alignment region M4 is present on mask MA4 and not on mask MA3, the mask is identified as mask MA4.

It will be appreciated that because the alignment region, or even the mask on which the mark is present, can be identified, the alignment region could be described as information range (in the sense that it provides identity information).

It will be appreciated that there is a number of alternatives to features having a relatively high reflectivity and to area between the features having a lower reflectivity.

1. The features may be formed by spots with low reflectivity for specific radiation. The area outside the spots would have higher reflectivity for that radiation.

2. The features may be formed by spots with a different transmission than the background for specific radiation. The mask would then be placed between a sensor (in case the sensor is a position sensitive device such as a CCD-camera) or set of sensors (in case the sensors are not position sensitive devices, e.g. the sensors are photocells) and the radiation source.

3. The features may be formed by spots which scatter specific incoming radiation in a direction different from the direction into which the background scatters the incoming radiation 4. The features may be formed by spots which diffract specific incoming radiation in a direction different from the direction into which the background diffracts the specific incoming radiation.

5. The features may be areas which are elevated above the rest of the alignment region. By radiating light parallel to the measurement surface, the presence of such a feature will block the radiation. A sensor opposite to the radiation source will now be able to detect the presence of a feature.

Other types of features can be used for the invention, as will be appreciated by the person skilled in the art.

It will be appreciated that any device capable of determining the position information of features in the alignment region can be used. The features can be circuit features such as pick and place components, vias or conducting areas.

It is not necessary that the sensor consists of one measurement device. Any set of suitable detectors with known relative positions, can be used as a sensor to determine the position of features in the alignment region. Each measurement device detects the presence or absence of a feature in its measurement area. The positions of detected features are indicated by the identity of the measurement devices which detected the features. Examples of such devices are air gauges (capable of determining local heights), capacitance sensors (capable of determining local capacitance) and photodiodes. It will be appreciated that different detection principles correspond to the different measurement devices.

The detection optics DO may not be perfect and may cause aberrations in imaging the measurement area onto the camera CAM. For instance the aberrations may be smallest in the center of the image. In such case, the accuracy of the measured position may be optimized by using only the positions of features in the center of the image. After identifying a first feature, a second feature close to the center may be selected and the measured position of that second feature may be used for the position determination of the alignment region.

When the sensor is first used (and/or periodically thereafter), it may be desirable or necessary to calibrate it. The sensor is calibrated using the measured positions and the positions stored in processing device PPD (FIG. 2). Having identified features F5 and F6 (FIG. 5), the measured distance can be compared with the distance determined from the positions stored in processing device PPD. The comparison is obtained by determining a ratio between the measured distance and the distance determined by the positions stored in processing device PPD. The ratio links 1 unit distance in the coordinate system of the sensor to 1 unit distance in the coordinate system of the mask MA. The sensor is calibrated by dividing the measured distances to the origin of the sensor by the determined ratio.

It will be understood by a person skilled in the art that other parameters which influence measurement by the sensor (such as rotation, field distortion and aberrations) can also be calibrated. For this calibration it may be desired to use the least squares criterion or any other suitable criterion to identify measured features and at the same time determine a parameter of the transformation going from the coordinate system of the mask MA to the coordinate system of the sensor. The alignment region of the marker as measured by the sensor may in some cases be rotated or expanded. For instance it can have any rotational angle around any axis, in addition to having an unknown position at the moment of measuring the positions of features in the measurement area with a sensor. Further possible transformations are symmetric rotation, asymmetric rotation, symmetric magnification, asymmetric magnification or higher order parameters such as position dependency of $x^2$ or $xy$.

This problem is solved in an embodiment of the invention by using an inverse transformation model with a parameter to be determined. The inverse transformation is applied to the positions of the measured features, resulting in transformed locations as a function of the parameter. By applying the least squares criterion to the differences between positions of features in the reference information, and transformed positions of the measured features, one can find the parameter. In the most simple form of the model the inverse transformation model is a translation. The outcome of the model is the position. In another form of the model the rotation angle around the x-axis is a parameter. This is determined simultaneously with the position.

It will be understood by a person skilled in the art that a transformation model may equally well be applied to features in the reference table instead of to the measurements of the features. However since there may be more features in the reference information than in the subset of features that is measured, this may cause more computational effort than applying the inverse transformation model to the positions of the measured features. It will also be understood by a person skilled in the art that both the transformation model and the inverse transformation model may be applied to find several parameters simultaneously.

Embodiments of the invention may be advantageously used when the detection optics DO, shown schematically in FIG. 2, are telecentric on the side facing the mask. Telecentricity is useful because it ensures that the distance between the features in the image does not depend on the distance between the mask MA and the detection optics DO. Determining a position of the mask in x and y coordinates therefore is independent of the z-coordinate of the mask.

A further benefit of using telecentric detection optics is that the size of the features U5,U6 (FIG. 6) as measured, can be used to determine the distance of the mask MA from the detection optics DO. The distance of the camera CAM to the detection optics DO is fixed at a known distance to the detection optics DO, defining an image plane. A sharp image IA2 is formed when the alignment region on mask MA lies in an object plane which is conjugate to the image plane of the detection optics. If the alignment region M2 is not in the related, conjugate object plane, the features in the image IA2 may be blurred, and therefore appear larger than when the alignment region M2 is in the conjugate object plane. The size of the features U5,U6 is measured and used to indicate the distance between the alignment region M2 and the detection optics. With the known fixed distance of the camera CAM to the detection optics DO, the size of the features U5,U6 indicates the distance to the alignment region and the camera CAM.

A further advantage can be gained by using double telecentric detection optics. By using double telecentric detection optics, the distance between the features in the image does not depend on the distance of the camera CAM to the detection optics. Therefore an accurate determination of the distance between the camera CAM to the detection optics is not required.

When the mask contains two features, the position and orientation of the mask can be determined, unless the mask has been rotated by 180 degrees around a point midway between both features. When this occurs, the features swap position, and the measurements may mistake one feature for the other. Depending on the exact identification method, the swap in the identification might also take place for a rotation of 90 degrees.

Because of the handling of masks in a lithographic production environment the orientation will be known within much better accuracy than 90 degrees, and the problem is avoided. In the event an unknown rotation may have occurred, the mask may need to contain at least three features A,B,C at unique positions. Unique positions means that the distance between A and B differs from the distance between B and C and from the distance between A and C. The measurement of the position and distance between any two features forming a subset of features can be compared to the reference information stored in position processing device PPD. One of the three reference distances will give the closest match to the measured distance. In the event the positions of the features A and B have been determined, then to determine the orientation, the feature C, which can be considered to form a further subset of features, is also measured. The further subset of features could contain additional features, which may also be used to measure the rotation.

Independent measurements may be used to improve the accuracy of a method according to an embodiment of the invention. For instance the position of the mask may be determined using a first and a second (e.g. CCD, CMOS) camera, each measuring a respective one of two alignment regions with known relative positions. The relative positions of the first and the second cameras is known. The measured position for each of the two alignment regions indicates the position of the mask. The measured positions of the alignment regions are compared with their expected positions. This measures the rotation of the mask relative to the first and second cameras. To reduce the measurement noise, the positions determined with the first and the second cameras may be averaged. Alternatively the measurements may be repeated. Where this is done, the measurements for which the position information of the first camera matches best with the position information of the second camera, is selected as being the correct measurement. In addition, several measurements with one camera CAM of one alignment region can be averaged.

The position of the mask, determined using a method according to an embodiment of the invention, may be used to control the relative positions of the mask and the substrate such that a projection beam of radiation patterned by the mask will be exactly (e.g. to a high degree of accuracy, such as nanometer) on top of a target area on the substrate. Alternatively the position of the mask may be controlled, with the substrate maintained in a fixed position. Alternatively a control unit may control the position of the substrate based upon the position of the mask, with the mask maintained in the determined position. A control unit may be provided to control the relative position of the mask and the substrate.

In an advantageous use of an embodiment of the invention, the rotation of the mask relative to the sensor is determined and then adjusted to a desired angle. The desired angle is such that the image of the mask formed by the projection system PL has the same rotation as the target area on the substrate. Alternatively the rotation of the substrate may be adjusted.

It will be appreciated by the person skilled in the art, that the reference information may be provided in different ways. The reference information can be stored in a separate memory unit (e.g. semiconductor memory or one or more disk drives) connected to the position processing device PPD.

For the purpose of explaining principles of the invention, examples are given of an alignment region on a mask. It will be appreciated that embodiments of the invention may be practiced on substrates as well, or on an object provided with an alignment region having suitable features, the object being supported by an object table, for example a substrate table or mask table. Alternatively the object table may be provided with an alignment region having suitable features.

According to one embodiment, a method of determining a position of an object provided with a plurality of features having unique relative positions, in a lithographic apparatus having a sensor, comprises providing reference information relating the positions of the features wherein one position is an absolute position; characterized by measuring the position of a subset of the features using the sensor wherein at least one position is an absolute position in a coordinate system; and identifying one or more of the measured features based upon the unique relative position of the one or more features with respect to the other features; determining the position of the object using the identity of the one or more identified features, the reference information and one or more of the measured absolute positions in the coordinate system.

A lithographic apparatus according to a further embodiment comprises an object table for supporting an object, the object being provided with a plurality of features having unique relative positions; a position sensor arranged to detect a subset of the features on the object; characterized by; a memory unit to store reference information relating the positions of the plurality of features, wherein one position is an absolute position in a coordinate system; a processing device connected to the position sensor and to the memory unit, arranged to identify one or more features out of the measured subset of features, based upon the unique relative position of the one or more features with respect to the other features and arranged to determine the position of the object relative to the sensor using the reference information and the measured absolute position in the coordinate system.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The description is not intended to limit the invention.

What is claimed is:

1. A method of determining, in a lithographic apparatus having a sensor, a position of an object provided with a plurality of features having unique positions relative to one another, the method comprising:

providing reference information indicating, relative to a position of one of the plurality of features, the positions of the rest of the plurality of features;

providing the sensor with a sensor image area configured to identify at least one detected feature in all possible sensor images;

using the sensor to measure positions of each of a subset of the plurality of features, the measured positions including a reference position in a coordinate system;

identifying a feature in the subset, based upon the measured position of the feature relative to the other measured features; and determining a position of the object, based on the identity of the identified feature, the reference information, and the measured reference position in the coordinate system.

2. The method of determining according to claim 1, wherein the object is provided with three features, and wherein the subset comprises two features.

3. The method of determining according to claim 1, wherein the sensor comprises a set of measurement devices with known positions relative to one another, the measuring devices being configured to detect whether a feature is present, and wherein the method comprises indicating the position of a feature according to the identity of a measurement device that detects the feature.

4. The method of determining according to claim 1, said method comprising moving the object based upon said determining a position of the object.

5. The method of determining according to claim 1, wherein the object comprises one among the group consisting of a substrate, a substrate table configured to support a substrate, a patterning structure, and a support table configured to support a patterning structure.

6. The method of determining according to claim 1, wherein another feature is identified, said method comprising:

determining a measured distance based on the measured
positions of two identified features of the plurality of
features;
retrieving from the reference information a reference
distance between the two identified features; and
determining a ratio between the measured distance and
the reference distance;
calibrating the sensor based on the determined ratio.

7. The method of claim 1, wherein the positions of the rest of the plurality of fratures indicated in said reference information have a sufficiently high density that, for all possible sensor images, there is a sufficient number of said features within the sensor image area to enable indentification of said at least one detected feature.

8. A method of determining, in a lithographic apparatus having a sensor, a position of an object provided with a plurality of features having unique positions relative to one another, the method comprising:
   providing reference information indicating, relative to a position of one of the plurality of features, the positions of the rest of the plurality of features;
   using the sensor to measure positions of each of a subset of the plurality of features, the measured positions including a reference position in a coordinate system;
   identifying a feature in the subset, based upon the measured position of the feature relative to the other measured features;
   determining a position of the object, based on the identity of the identified feature, the reference information, and the measured reference position in the coordinate system; and
   moving the object and another object relative to each other based upon said determining a position of the object.

9. A method of determining, in a lithographic apparatus having a sensor, a position of an object provided with a plurality of features having unique positions relative to one another, the method comprising:
   providing reference information indicating, relative to a position of one of the plurality of features, the positions of the rest of the plurality of features;
   using the sensor to measure positions of each of a subset of the plurality of features, the measured positions including a reference position in a coordinate system;
   identifying a feature in the subset, based upon the measured position of the feature relative to the other measured features; and
   determining a position of the object, based on the identity of the identified feature, the reference information, and the measured reference position in the coordinate system;
   wherein the plurality of features lack rotational symmetry, and
   wherein the method comprises determining a rotation of the object relative to the sensor based on the measured positions of the features of a further subset of the subset of the plurality of features.

10. A method of determining, in a lithographic apparatus having a sensor, a position of an object provided with a plurality of features having unique positions relative to one another, the method comprising:
    providing reference information indicating, relative to a position of one of the plurality of features, the positions of the rest of the plurality of features;
    using the sensor to measure in an alignment area positions of each of a subset of the plurality of features, the measured positions including a reference position in a coordinate system;
    identifying a feature in the subset, based upon the measured position of the feature relative to the other measured features; and
    determining a position of the object, based on the identity of the identified feature, the reference information, and the measured reference position in the coordinate system,
    wherein each of the plurality of features lacks rotational symmetry, and
    wherein the method comprises determining a rotation of the object relative to the sensor based on the measured positions of the features of a further subset of the subset of the plurality of features.

11. A method of determining, in a lithographic apparatus having a sensor, a position of an object provided with a plurality of features having unique positions relative to one another, the method comprising:
    providing reference information indicating, relative to a position of one of the plurality of features, the positions of the rest of the plurality of features;
    using the sensor to measure positions of each of a subset of the plurality of features, the measured positions including a reference position in a coordinate system;
    identifying a feature in the subset, based upon the measured position of the feature relative to the other measured features;
    determining a position of the object, based on the identity of the identified feature, the reference information, and the measured reference position in the coordinate system; and
    subsequent to said identifying a feature, selecting a feature based upon an accuracy of its measured position,
    wherein said determining a position of the object is based on a position of the selected feature.

12. A lithographic apparatus comprising:
    an object table configured to support an object, the object being provided with a plurality of features having unique positions relative to one another;
    a position sensor arranged to detect each of a subset of the plurality of features;
    a memory unit configured to store reference information indicating, relative to a position of a reference feature of the plurality of features, the positions of the rest of the plurality of features; and
    a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system
    wherein said position sensor is configured so that, in all possible sensor images, said processing device is able to identify at least one of the plurality of features.

13. The lithographic apparatus according to claim 11, wherein the object is provided with three features, and
    wherein the subset comprises two features.

14. The lithographic apparatus according to claim 11, wherein the sensor comprises a set of measurement devices with known positions relative to one another, the measuring devices being configured to detect whether a feature is present, and wherein the processing device indicates the position of a feature according to the identity of a measurement device that detects the feature.

15. The lithographic apparatus according to claim 11, said apparatus comprising a positioner configured to move the object based upon the determined position of the object.

16. The lithographic apparatus according to claim 11, wherein the object comprises one among the group consisting of a substrate, a substrate table configured to support a substrate, a patterning structure, and a support table configured to support a patterning structure.

17. The lithographic apparatus according to claim 11, wherein the processing device is configured to identify another feature of the subset, based on a detected position of the feature with respect to the other detected features, and
wherein said processing device is configured to determine a measured distance based on the measured positions of two identified features of the plurality of features, to retrieve from the memory unit a reference distance between the two identified features, and to determine a ratio between the measured distance and the reference distance, and
wherein the apparatus is configured to calibrate the sensor based on the determined ratio.

18. The lithographic apparatus of claim 12, wherein the position of the rest of the plurality of features indicated in said reference information have a sufficiently high density that, for all possible sensor images, there is a sufficient number of the features within the sensor image area to enable identification of said at least one detected feature, and
wherein the sensor image area of the position sensor is large enough to encompass said Sufficient number of the features.

19. The lithographic apparatus of claim 12, wherein the processing device is configured to identify, based on the reference information, a solitary one of the features when the solitary one of the features is the only feature detected within the sensor image area.

20. A lithographic apparatus comprising:
an object table configured to support an object, the object being provided with a plurality of features having unique positions relative to one another;
a position sensor arranged to detect each of a subset of the plurality of features;
a memory unit configured to store reference information indicating, relative to a position of a reference feature of the plurality of features, the positions of the rest of the plurality of features;
a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system; and
telecentric detection optics located between the object and the position sensor.

21. A lithographic apparatus comprising:
an object table configured to support an object, the object being provided with a plurality of features having unique positions relative to one another;
a position sensor arranged to detect each of a subset of the plurality of features;
a memory unit configured to store reference information indicating, relative to a position of a reference feature of the plurality of features, the positions of the rest of the plurality of features;
a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system; and
a positioner configured to move another object relative to the object based upon the determined position of the object.

22. A lithographic apparatus comprising:
an object table configured to support an object, the object being provided with a plurality of features having unique positions relative to one another;
a position sensor arranged to detect each of a subset of the plurality of features;
a memory unit configured to store reference information indicating, relative to a position of a reference feature of the plurality of features, the positions of the rest of the plurality of features; and
a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system,
wherein the plurality of features lack rotational symmetry, and
wherein the processing device is configured to determine a rotation of the object relative to the sensor based on the measured positions of the features of a further subset of the subset of the plurality of features.

23. A lithographic apparatus comprising:
an object table configured to support an object, the object being provided with a plurality of features having unique positions relative to one another;
a position sensor arranged to detect each of a subset of the plurality of features;
a memory unit configured to store reference information indicating, relative to a position of a reference feature of the plurality of features, the positions of the rest of the plurality of features; and
a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system,
wherein each of the plurality of features lacks rotational symmetry, and
wherein the processing device is configured to determine a rotation of the object relative to the sensor based on the measured positions of the features of a further subset of the subset of the plurality of features.

24. A lithographic apparatus comprising:
an object table configured to support an object, the object being provided with a plurality of features having unique positions relative to one another;
a position sensor arranged to detect each of a subset of the plurality of features;

a memory unit configured to store reference information indicating, relative to a position of a reference feature of the plurality of features, the positions of the rest of the plurality of features; and a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system, wherein said processing device is configured to select a feature based upon an accuracy of its measured position and to determine a position of the object based on a position of the selected feature.

25. A method of determining a position of an object provided with a plurality of features, each of the plurality of features having a unique position in a two-dimensional plane relative to any other two of the plurality of features, the method comprising:

using a sensor of a lithographic apparatus to measure positions of each of a subset of the plurality of features;

providing the sensor with a sensor image area configured to identify at least one detected feature in all possible sensor images;

identifying a feature in the subset, based upon the measured position of the feature relative to the other measured features; and determining a position of the object, based on (A) the identity of the identified feature, (B) reference information indicating, relative to a position of a reference feature of the plurality of features, the positions of the rest of the plurality of features, and (C) a position of the reference feature in a coordinate system.

* * * * *